United States Patent
Lee

(10) Patent No.: US 12,319,613 B2
(45) Date of Patent: *Jun. 3, 2025

(54) DISPLAY APPARATUS AND METHOD OF MANUFACTURING THE SAME

(71) Applicant: Samsung Display Co., Ltd., Yongin-si (KR)

(72) Inventor: Hoikwan Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/347,150

(22) Filed: Jul. 5, 2023

(65) Prior Publication Data

US 2023/0345758 A1 Oct. 26, 2023

Related U.S. Application Data

(63) Continuation of application No. 17/142,812, filed on Jan. 6, 2021, now Pat. No. 11,711,937.

(30) Foreign Application Priority Data

Jul. 1, 2020 (KR) .................... 10-2020-0081068

(51) Int. Cl.
*C03C 21/00* (2006.01)
*H10K 50/84* (2023.01)
(Continued)

(52) U.S. Cl.
CPC ......... *C03C 21/002* (2013.01); *H10K 50/841* (2023.02); *H10K 50/86* (2023.02);
(Continued)

(58) Field of Classification Search
CPC ...... H10K 50/841; H10K 50/86; H10K 59/12; H10K 59/40; H10K 71/00; H10K 77/111;
(Continued)

(56) References Cited

U.S. PATENT DOCUMENTS 11,711,937 B2 * 7/2023 Lee .................. H10K 59/40
257/40
2012/0052271 A1 3/2012 Gomez et al.
(Continued)

FOREIGN PATENT DOCUMENTS

KR 10-2016-0130914 11/2016
KR 10-2017-0015876 2/2017
(Continued)

OTHER PUBLICATIONS

Definition of "Tensile strength." Merriam-Webster.com Dictionary, Merriam-Webster, https://www.merriam-webster.com/dictionary/tensile%20strength. Accessed Oct. 11, 2024. (Year: 2024).*

(Continued)

*Primary Examiner* — J. E. Schoenholtz
(74) *Attorney, Agent, or Firm* — KILE PARK REED & HOUTTEMAN PLLC

(57) ABSTRACT

A display apparatus includes a display panel including pixels and a cover window disposed on the display panel. The cover window includes a flat portion having a first thickness, and a folding portion having a second thickness that is less than the first thickness of the flat portion, the folding portion being adjacent to the flat portion. A first stress profile of the flat portion of the cover window that is a stress change along a depth direction from a surface of the flat portion of the cover window is different from a second stress profile of the folding portion of the cover window that is a stress change along a depth direction from a surface of the folding portion of the cover window.

31 Claims, 12 Drawing Sheets

(51) Int. Cl.
  *H10K 50/86* (2023.01)
  *H10K 59/12* (2023.01)
  *H10K 59/40* (2023.01)
  *H10K 71/00* (2023.01)
  *H10K 77/10* (2023.01)
  *H10K 102/00* (2023.01)

(52) U.S. Cl.
  CPC ............. *H10K 59/12* (2023.02); *H10K 59/40* (2023.02); *H10K 71/00* (2023.02); *H10K 77/111* (2023.02); *H10K 59/1201* (2023.02); *H10K 2102/311* (2023.02); *H10K 2102/351* (2023.02)

(58) Field of Classification Search
  CPC ......... H10K 59/1201; H10K 2102/311; H10K 2102/351; H10K 59/8791; H10K 59/87; H10K 59/122; Y02E 10/549; C03C 21/002; C08J 7/12
  See application file for complete search history.

(56) References Cited

U.S. PATENT DOCUMENTS

| | | | |
|---|---|---|---|
| 2014/0029212 A1 | 1/2014 | Hwang et al. | |
| 2015/0030834 A1 | 1/2015 | Morey et al. | |
| 2015/0259244 A1 | 9/2015 | Amin et al. | |
| 2016/0326050 A1 | 11/2016 | Lee et al. | |
| 2019/0382302 A1 | 12/2019 | Xue et al. | |
| 2020/0017406 A1* | 1/2020 | Wilson | C03C 21/00 |
| 2020/0039876 A1 | 2/2020 | Imakita et al. | |
| 2020/0071225 A1 | 3/2020 | Lee et al. | |
| 2020/0136067 A1 | 4/2020 | Kim et al. | |
| 2020/0324521 A1* | 10/2020 | Park | B24B 7/24 |
| 2021/0066641 A1* | 3/2021 | Ai | H10K 50/841 |
| 2021/0107826 A1* | 4/2021 | Hwang | C03C 17/28 |
| 2021/0179482 A1 | 6/2021 | Lezzi et al. | |
| 2021/0337688 A1 | 10/2021 | Ge | |

FOREIGN PATENT DOCUMENTS

| | | |
|---|---|---|
| KR | 10-1958802 | 3/2019 |
| KR | 10-2019-0077605 | 7/2019 |
| KR | 10-2019-0121367 | 10/2019 |
| KR | 10-2019-0130585 | 11/2019 |
| KR | 10-2069040 | 1/2020 |
| KR | 10-2020-0027110 | 3/2020 |
| KR | 10-2020-0049463 | 5/2020 |
| KR | 10-2111138 | 5/2020 |
| WO | 2020/124766 | 6/2020 |

OTHER PUBLICATIONS

Mechanical Properties of Glass: Design to Survive Stress, Impact and Abrasion, A. Willsey, Sep. 28, 2015 downloaded from URL<https://www.koppglass.com/blog/mechanical-properties-glass-design-survive-stress-impact-and-abrasion> on Jan. 24, 2025 (Year: 2015).*

Varshneya, Arun K. "The physics of chemical strengthening of Glass: Room for a new view." Journal of Non-Crystalline Solids, vol. 356, No. 44-49, Oct. 2010, pp. 2289-2294, https://doi.org/10.1016/j.jnoncrysol.2010.05.010. (Year: 2010).*

Macrelli, Guglielmo, et al. "Coupling of diffusion and chemical stress: The case of ion exchange in Glass." Journal of the American Ceramic Society, vol. 104, No. 11, Jun. 23, 2021, pp. 5599-5613, https://doi.org/10.1111/jace.17926. (Year: 2021).*

*Magsil Corp.* v. *Seagate Technology*, 764 F. Supp. 2d 674 (D. Del. 2011). (Year: 2011).

*MagSil Corp.* v. *Hitachi Global Storage Techs., Inc.*, 687 F.3d 1377 (Fed. Cir. 2012). (Year: 2012).

* cited by examiner

DISPLAY APPARATUS AND METHOD OF MANUFACTURING THE SAME

CROSS-REFERENCE TO RELATED APPLICATION(S)

This is a continuation application based on currently U.S. patent application Ser. No. 17/142,812 (now U.S. Pat. No. 11,711,937), filed on Jan. 6, 2021, the disclosure of which is incorporated herein by reference in its entirety. U.S. patent application Ser. No. 17/142,812 claims priority benefit of Korean Patent Application No. 10-2020-0081068, filed on Jul. 1, 2020, in the Korean Intellectual Property Office (KIPO), the disclosure of which is incorporated herein by reference in its entirety for all purposes.

BACKGROUND

1. Technical Field

One or more embodiments relate to a display apparatus and a method of manufacturing the same, and, to a foldable display apparatus and a method of manufacturing the same.

2. Description of the Related Art

Mobile electronic devices are widely used. Recently, tablet personal computers (PCs), in addition to small electronic devices such as mobile phones, have been widely used as mobile electronic devices.

Such a mobile electronic device may include a display apparatus to provide various functions, for example, visual information such as an image or images to a user. As sizes of other components for driving a display apparatus have recently decreased, the proportion of the display apparatus in an electronic device has gradually increased, and a display apparatus that may be bent or folded into any of various shapes is being developed.

A display apparatus may include a cover window that may protect elements of the display apparatus. As for a foldable display apparatus, a cover window provided in the foldable display apparatus should also be foldable and the durability of the cover window should also be ensured.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments provide a display apparatus including a cover window that may be foldable and may have improved durability and strength against an impact and a method of manufacturing the display apparatus. However, the above problem is merely an example, and thus does not limit the scope of the disclosure.

Additional aspects will be set forth in part in the description which follows and, in part, will be apparent from the description, or may be learned by practice of the presented embodiments of the disclosure.

According to one or more embodiments, a display apparatus may include a display panel including pixels; and a cover window disposed on the display panel, wherein the cover window may include a flat portion having a first thickness; and a folding portion having a second thickness that may be less than the first thickness of the flat portion, the folding portion being adjacent to the flat portion, and a first stress profile of the flat portion of the cover window that may be a stress change along a depth direction from a surface of the flat portion of the cover window may be different from a second stress profile of the folding portion of the cover window that may be a stress change along a depth direction from a surface of the folding portion of the cover window.

The second thickness of the folding portion of the cover window may be in a range from about 20 μm to about 30 μm.

A surface compressive stress on the surface of the flat portion of the cover window may be greater than a surface compressive stress on the surface of the folding portion of the cover window.

A surface compressive stress on the surface of the flat portion of the cover window may be in a range from about 650 MPa to about 800 MPa.

An absolute value of a gradient in a first interval of the first stress profile of the flat portion of the cover window may be greater than an absolute value of a gradient in a second interval adjacent to the first interval, the first interval may be an interval from the surface of the flat portion of the cover window to a first transition depth, and the second interval may be an interval from the first transition depth to a first compression depth.

A compressive stress at the first compression depth may be about 0.

The first compression depth may be about equal to or greater than about 15% of the first thickness of the flat portion of the cover window.

The first transition depth may be less than about 10% of the first thickness of the flat portion of the cover window.

The absolute value of the gradient in the first interval may be greater than about 35 MPa/μm.

A surface compressive stress on the surface of the folding portion of the cover window may be in a range from about 400 MPa to about 700 MPa.

An absolute value of a gradient in a third interval of the second stress profile of the folding portion of the cover window may be greater than an absolute value of a gradient in a fourth interval adjacent to the third interval, the third interval may be an interval from the surface of the folding portion of the cover window to a second transition depth, and the fourth interval may be an interval from the second transition depth to a second compression depth.

The second stress profile of the folding portion of the cover window may include a curved line in an interval about equal to or greater than the second transition depth of the folding portion of the cover window.

A compressive stress at the second compression depth may be about 0.

The second compression depth may be in a range from about 20% to about 25% of the second thickness of the folding portion.

The second transition depth may be less than 20% of the second thickness of the folding portion of the cover window.

The absolute value of the gradient in the third interval may be greater than about 40 MPa/μm.

According to one or more embodiments, a method of manufacturing a display apparatus may include preparing a display panel; preparing a cover window; and adhering the cover window to the display panel, wherein the cover window may include a flat portion having a first thickness, and a folding portion having a second thickness less than the first thickness, the folding portion being adjacent to the flat portion, and a first stress profile of the flat portion that may be a stress change along a depth direction from a surface of the flat portion may be different from a second stress profile of the folding portion that may be a stress change along a depth direction from a surface of the folding portion. The first stress profile represents an amount of compressive or tensile stress stored in the cover window at particular locations The preparing of the cover window may include preparing a member including the first thickness; forming the folding portion to the second thickness by processing a part of the member; performing a first strengthening step on the member by ion exchange by using a mixed salt including a first salt and a second salt that may be different from the first salt; and performing a second strengthening step on the member by ion exchange by using a single salt including the first salt.

The first strengthening step may be performed for about 30 minutes to about 6 hours at a temperature in a range from about 350° C. to about 460° C., and a mole ratio between the first salt and the second salt may be about 7:3.

The second strengthening step may be performed for about 5 minutes to about 2 hours at a temperature in a range from about 350° C. to about 460° C.

The first salt may be sodium nitrate (NaNO3), and the second salt may be potassium nitrate (KNO3).

Other features and advantages of the disclosure will become more apparent from the drawings, the claims, and the detailed description.

These embodiments may be implemented by using a system, a method, a computer program, or a combination thereof.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1A:
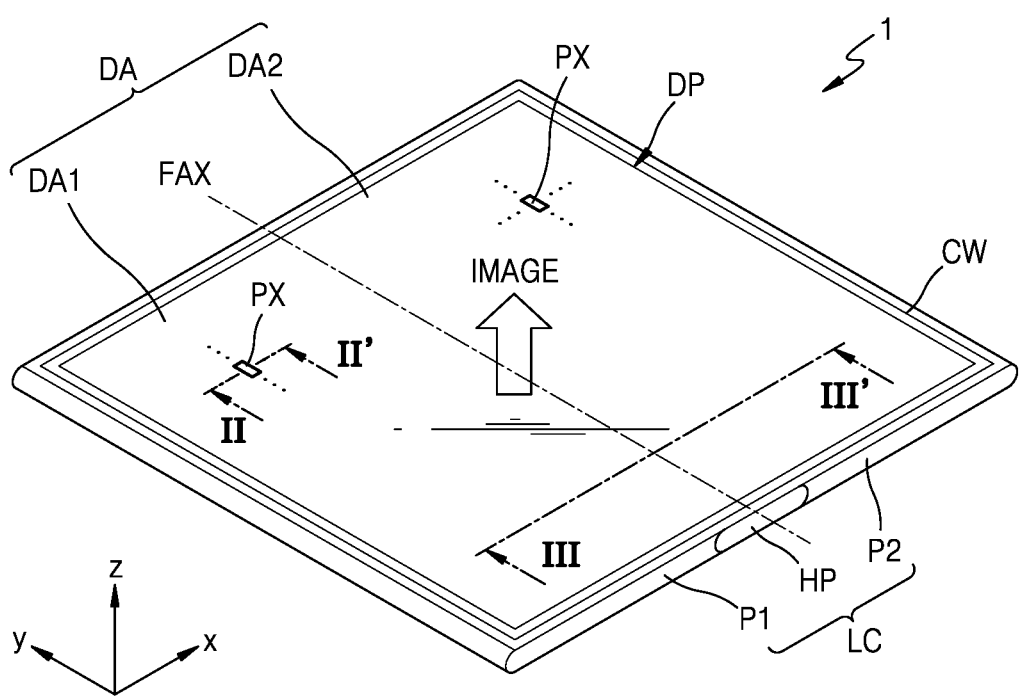
FIGS. 1A and 1B are perspective views of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

The disclosure may include various embodiments and modifications, and embodiments thereof will be illustrated in the drawings and will be described herein in detail. The effects and features of the disclosure and the accompanying methods thereof will become apparent from the following description of the embodiments, taken in conjunction with the accompanying drawings. However, the disclosure is not limited to the embodiments described below, and may be embodied in various modes.

Reference will now be made in detail to embodiments, examples of which are illustrated in the accompanying drawings. In the drawings, the same or corresponding elements are denoted by the same reference numerals, and a repeated explanation thereof will not be given.

It will be understood that although the terms "first," "second," etc. may be used herein to describe various elements, these elements should not be limited by these terms. These terms are only used to distinguish one element from another. For example, a first element referred to as a first element in one embodiment can be referred to as a second element in another embodiment without departing from the scope of the appended claims. The terms of a singular form may include plural forms unless referred to the contrary.

As used herein, the singular forms "a," "an," and "the" are intended to include the plural forms as well, unless the context clearly indicates otherwise.

It will be further understood that the terms "comprises" and/or "comprising" "includes" and/or "including" and "have" and/or "having" and their variations thereof as used herein specify the presence of stated features or elements, but do not preclude the presence or addition of one or more other features or elements.

It will be understood that when a layer, region, area, or element is referred to as being "formed on" another layer, region, area, or element, it may be directly or indirectly formed on the other layer, region, area, or element. That is, for example, intervening layers, regions, areas or elements may be present.

Sizes of elements in the drawings may be exaggerated or contracted for convenience of explanation. In other words, because sizes and thicknesses of components in the drawings are arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Figure 1B:
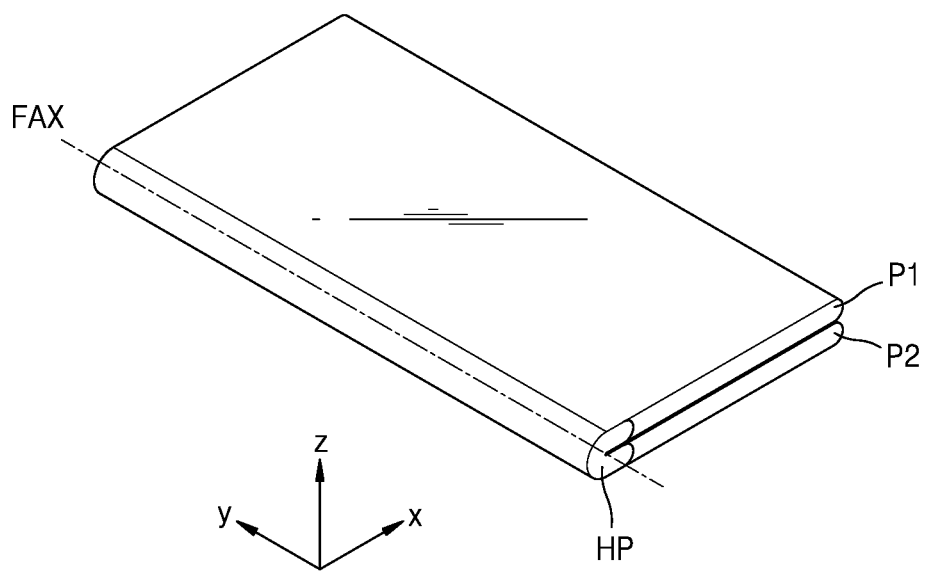

FIGS. 1A and 1B are perspective views of a display apparatus according to an embodiment of the disclosure. FIG. 1A illustrates a state where a display apparatus is unfolded. FIG. 1B illustrates a state where the display apparatus is folded.

Referring to FIGS. 1A and 1B, a display apparatus 1 may include a lower cover LC, a display panel DP, and a cover window CW.

The lower cover LC may include a first portion P1 and a second portion P2 that may support the display panel DP. The lower cover LC may be folded about a folding axis FAX between the first portion P1 and the second portion P2. In an embodiment, a hinge portion HP may be located or disposed between the first portion P1 and the second portion P2.

The display panel DP may include a display area DA. The display panel DP may provide an image or images through an array of pixels PX arranged or disposed in the display area DA. The pixels PX may be defined as a light-emitting area in which light may be emitted by a light-emitting element electrically connected to a pixel circuit. The light-emitting element may be, for example, an organic light emitting diode (OLED). Each of the pixels PX may emit red light, green light, or blue light. In an embodiment, each of the pixels PX may emit red light, green light, blue light, or white light.

The display area DA may include a first display area DA1 and a second display area DA2 that may be located or disposed on both sides of the folding axis FAX crossing or intersecting the display area DA. The first display area DA1 and the second display area DA2 may be respectively located or disposed on the first portion P1 and the second portion P2 of the lower cover LC. The display panel DP may provide first and second images by using light emitted by the pixels PX respectively located or disposed in the first and second display areas DA1 and DA2. In an embodiment, the first and second images may be parts of one or an image provided through the display area DA of the display panel DP. Also, in an embodiment, the display panel DP may provide the first and second images that may be independent of each other.

The display panel DP may be folded about the folding axis FAX. In a case that the display panel DP is folded, the first display area DA1 and the second display area DA2 of the display panel DP may face each other.

Although the folding axis FAX extends in a y-direction in FIGS. 1A and 1B, in an embodiment, the folding axis FAX may extend in an x-direction. In an embodiment, the folding axis FAX in an xy plane may extend in a direction intersecting the x-direction and the y-direction. Also, although there is one folding axis FAX illustrated in FIGS. 1A and 1B, in an embodiment, the display panel DP may be folded multiple times about folding axes FAX crossing or intersecting the display area DA.

The cover window CW may be located or disposed on the display panel DP, and may cover or overlap the display panel DP. The cover window CW may be folded or bent according to an external force without producing cracks or the like within the spirit and the scope of the disclosure. In a case that the display panel DP is folded about the folding axis FAX, the cover window CW may also be folded and may cover or overlap the display panel DP.

Figure 2:
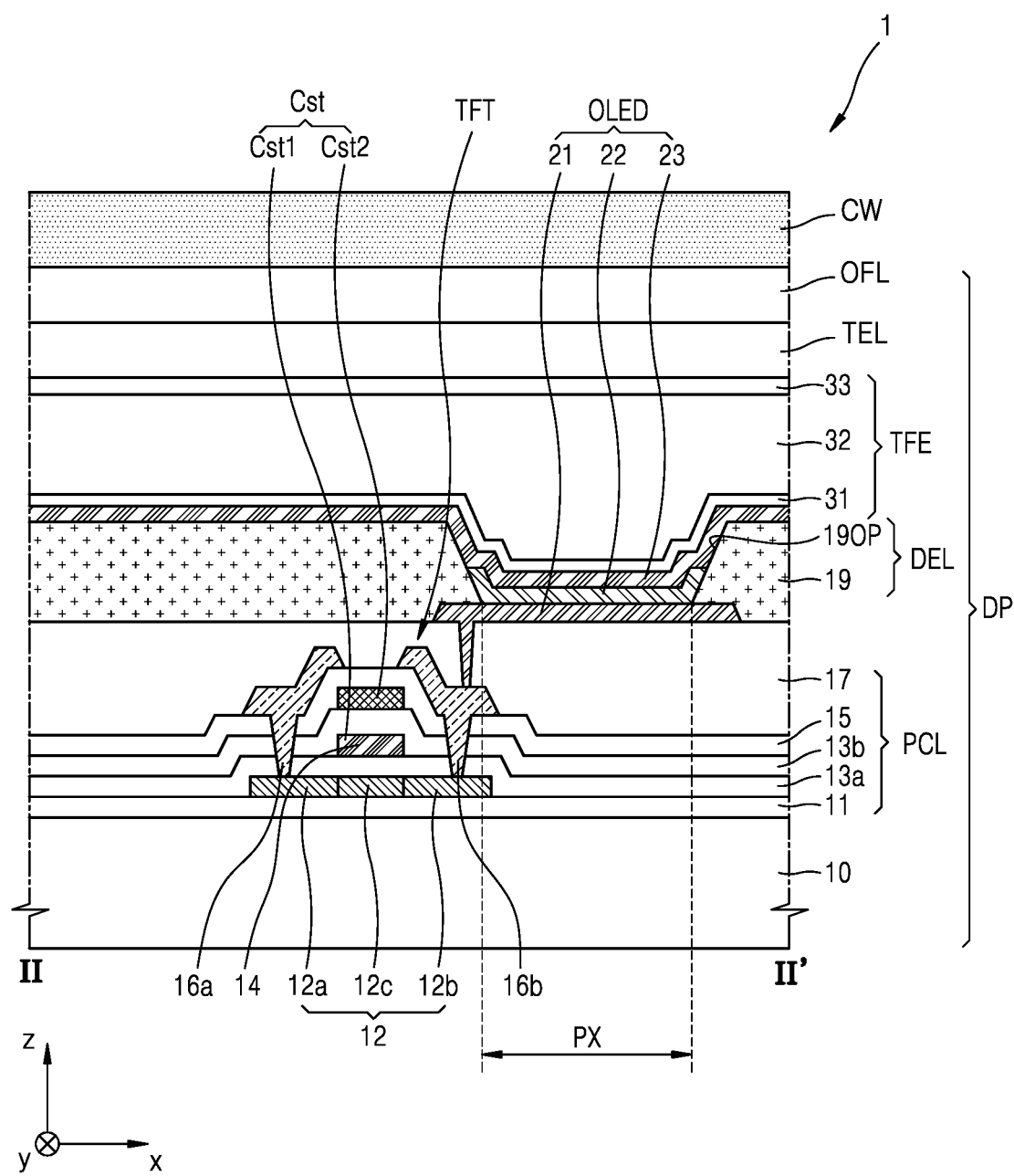
FIG. 2 is a schematic cross-sectional view illustrating a part of a display apparatus according to an embodiment.

FIG. 2 is a schematic cross-sectional view illustrating a part of a display apparatus according to an embodiment.

FIG. 2 may correspond to a schematic cross-sectional view taken along line II-II' of the display apparatus of FIG. 1A.

Referring to FIG. 2, the display panel DP may have a stacked structure including a substrate 10, a pixel circuit layer PCL, a display element layer DEL, a thin-film encapsulation layer TFE, a touch electrode layer TEL, and an optical functional layer OFL.

The substrate 10 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The pixel circuit layer PCL may be located or disposed on the substrate 10. In FIG. 2, the pixel circuit layer PCL may include a thin-film transistor TFT, and a buffer layer 11, a first gate insulating layer 13a, a second gate insulating layer 13b, an interlayer insulating layer 15, and a planarization insulating layer 17 located or disposed under or below and/or over elements of the thin-film transistor TFT.

The buffer layer 11 may reduce or prevent penetration of a foreign material, moisture, or external air from the bottom of the substrate 10, and may planarize the substrate 10. The buffer layer 11 may include an inorganic insulating material such as silicon nitride, silicon oxynitride, or silicon oxide, and may have a single or multi-layer structure including the inorganic insulating material.

The thin-film transistor TFT disposed on the buffer layer 11 may include a semiconductor layer 12, and the semiconductor layer 12 may include polysilicon. Alternatively, the semiconductor layer 12 may include amorphous silicon, an oxide semiconductor, or an organic semiconductor. The semiconductor layer 12 may include a channel region 12c and a drain region 12a and a source region 12b respectively located or disposed on or at both sides of the channel region 12c. A gate electrode 14 may overlap the channel region 12c.

The gate electrode 14 may include a low-resistance metal material. The gate electrode 14 may include a conductive material including molybdenum (Mo), aluminum (Al), copper (Cu), or titanium (Ti), and may have a single or multi-layer structure including the above material or materials.

The first gate insulating layer 13a disposed between the semiconductor layer 12 and the gate electrode 14 may include an inorganic insulating material such as silicon oxide ($SiO_2$), silicon nitride (SiNX), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 13b may be provided or disposed to cover or overlap the gate electrode 14. The second gate insulating layer 13b may include an inorganic insulating material such as silicon oxide ($SiO_2$), silicon nitride (SiNX), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), similar to the first gate insulating layer 13a.

An upper electrode Cst2 of a storage capacitor Cst may be located or disposed on the second gate insulating layer 13b. The upper electrode Cst2 may overlap the gate electrode 14 that may be located or disposed below the upper electrode Cst2. For example, the gate electrode 14 and the upper electrode Cst2 overlapping each other with the second gate insulating layer 13b disposed therebetween may form the storage capacitor Cst. For example, the gate electrode 14 may function as a lower electrode Cst1 of the storage capacitor Cst.

As such, the storage capacitor Cst and the thin-film transistor TFT may overlap each other. In an embodiment, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), and/or copper (Cu), and may have a single or multi-layer structure including the above material or materials.

The interlayer insulating layer 15 may cover or overlap the upper electrode Cst2. The interlayer insulating layer 15 may include silicon oxide ($SiO_2$), silicon nitride (SiNX), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 15 may have a single or multi-layer structure including the above inorganic insulating material or materials.

Each of a drain electrode 16a and a source electrode 16b may be located or disposed on the interlayer insulating layer 15. The drain electrode 16a and the source electrode 16b may be respectively electrically connected to the drain region 12a and the source region 12b through contact holes of insulating layers located or disposed under or below the drain electrode 16a and the source electrode 16b. The drain electrode 16a and the source electrode 16b may include a material having high conductivity. Each of the drain electrode 16a and the source electrode 16b may include a conductive material including molybdenum (Mo), aluminum (Al), copper (Cu), or titanium (Ti), and may have a single or multi-layer structure including the above material or materials. In an embodiment, each of the drain electrode 16a and the source electrode 16b may have a multi-layer structure including Ti/Al/Ti.

The planarization insulating layer 17 may include an organic insulating layer. The planarization insulating layer 17 may include an organic insulating material such as a general-purpose polymer (for example, polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element layer DEL may be located or disposed on the pixel circuit layer PCL having the above structure. The display element layer DEL may include an organic light emitting diode OLED as a light-emitting element, and the organic light-emitting diode OLED may have a stacked structure including a pixel electrode 21, an emission layer 22, and a common electrode 23. The pixel electrode 21 of the organic light-emitting diode OLED may be electrically connected to the thin-film transistor TFT through a contact hole of the planarization insulating layer 17.

The pixel electrode 21 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 21 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the pixel electrode 21 may include a film formed of ITO, IZO, ZnO, or In2O3 over/under or below the reflective film.

A pixel-defining film 19 having an opening 19OP through which a central portion of the pixel electrode 21 may be exposed may be located or disposed on the pixel electrode 21. The pixel-defining film 19 may include an organic insulating material and/or an inorganic insulating material. The opening 19OP may define a light-emitting area in which light may be emitted by the organic light-emitting diode OLED. For example, a size/width of the opening 19OP may correspond to a size/width of the light-emitting area. Accordingly, a size and/or a width of the pixel PX may depend on a size and/or a width of the opening 19OP of the pixel-defining film 19.

The emission layer 22 may be located or disposed in the opening 19OP of the pixel-defining film 19. The emission layer 22 may include a high or low molecular weight organic material emitting light of a certain or predetermined color. Alternatively, the emission layer 22 may include an inorganic light-emitting material, or may include quantum dots.

Although not shown in FIG. 2, a first functional layer and a second functional layer may be respectively located or disposed under or below and over the emission layer 22. The first functional layer may include, for example, a hole transport layer (HTL), or may include an HTL or a hole injection layer (HIL). The second functional layer that may be an element located or disposed over the emission layer 22 may be optional. The second functional layer may include an electron transport layer (ETL) and/or an electron injection layer (EIL). The first functional layer and/or the second functional layer may be a common layer formed or disposed to entirely cover or overlap the substrate 10, similar to the common electrode 23 as described below.

The common electrode 23 may be located or disposed over the pixel electrode 21, and may overlap the pixel electrode 21. The common electrode 23 may include a conductive material having a low work function. For example, the common electrode 23 may include a (semi-)transparent layer including silver (Ag), magnesium (Mg), aluminum (Al), platinum (Pt), palladium (Pd), gold (Au), nickel (Ni), neodymium (Nd), iridium (Jr), chromium (Cr), lithium (Li), calcium (Ca), or an alloy thereof. Alternatively, the common electrode 23 may include a layer formed of ITO, IZO, ZnO, or In2O3 on the (semi-)transparent layer including the above material or materials. The common electrode 23 may be integrally formed or integral to entirely cover or overlap the substrate 10.

The thin-film encapsulation layer TFE may be located or disposed on the display element layer DEL, and may cover or overlap the display element layer DEL. The thin-film encapsulation layer TFE may include at least one inorganic encapsulation layer and at least one organic encapsulation layer, and according to an embodiment, in FIG. 2, the thin-film encapsulation layer TFE may include a first inorganic encapsulation layer 31, an organic encapsulation layer 32, and a second inorganic encapsulation layer 33 that may be sequentially stacked.

Each of the first inorganic encapsulation layer 31 and the second inorganic encapsulation layer 33 may include one or more inorganic materials from among aluminum oxide, titanium oxide, tantalum oxide, hafnium oxide, zinc oxide, silicon oxide, silicon nitride, and silicon oxynitride. The organic encapsulation layer 32 may include a polymer-based material. Examples of the polymer-based material may include an acrylic resin, an epoxy resin, polyimide, and/or polyethylene. In an embodiment, the organic encapsulation layer 32 may include acrylate. The organic encapsulation layer 32 may be formed by curing a monomer or applying a polymer. The organic encapsulation layer 32 may be transparent.

The touch electrode layer TEL including touch electrodes may be located or disposed on the thin-film encapsulation layer TFE, and the optical functional layer OFL may be located or disposed on the touch electrode layer TEL. The touch electrode layer TEL may obtain coordinate information according to an external input, for example, a touch event. The optical functional layer OFL may reduce a reflectance of light (external light) incident on the display apparatus 1 from the outside, and/or may improve the color purity of light emitted by the display apparatus 1.

In an embodiment, the optical functional layer OFL may include a phase retarder and/or a polarizer. The phase retarder may be of a film type or a liquid-crystal coating type, and may include a $\lambda/2$ phase retarder and/or a $\lambda/4$ phase retarder. The polarizer may also be of a film type or a liquid-crystal coating type. The polarizer of the film type may include an elongated synthetic resin film, and the polarizer of the liquid-crystal coating type may include liquid crystals arranged with a certain or predetermined orientation. The phase retarder and the polarizer may include a protective film.

In an embodiment, the optical functional layer OFL may include a destructive interference structure. The destructive interference structure may include a first reflective layer and a second reflective layer that may be located or disposed on different layers. First reflected light and second reflected light respectively reflected by the first reflective layer and the second reflective layer may destructively interfere with each other, thereby reducing a reflectance of external light.

An adhesive member may be disposed between the touch electrode layer TEL and the optical functional layer OFL. Any of general adhesives may be used as the adhesive member. The adhesive member may be a pressure-sensitive adhesive (PSA).

The cover window CW may be located or disposed on the display panel DP. The cover window CW may be adhered to the display panel DP by the adhesive member. The adhesive member may be, for example, a PSA.

The cover window CW may have a high transmittance to transmit light emitted from the display panel DP, and may have a small thickness to minimize a weight of the display apparatus 1. Also, the cover window CW may have high strength and hardness to protect the display panel DP from an external impact. The cover window CW may include, for example, glass or plastic. In an embodiment, the cover window CW may include ultra-thin glass that may be strengthened through chemical strengthening or thermal strengthening.

Although the display apparatus 1 may include the organic light-emitting diode OLED as a light-emitting element in FIG. 2, the display apparatus 1 of the disclosure is not limited thereto. In an embodiment, the display apparatus 1 may be a light-emitting display including an inorganic light-emitting diode (for example, an inorganic light-emitting display or an inorganic electroluminescent (EL) display). The inorganic light-emitting diode may include a PN junction diode including materials based on an inorganic semiconductor. In a case that a voltage is applied in a forward direction to the PN junction diode, holes and electrons may be injected, and energy generated due to the recombination of the holes and the electrons may be converted into light energy to emit light of a certain or predetermined color. The inorganic light-emitting diode may have a width ranging from several to hundreds of micrometers, and, in an embodiment, the inorganic light-emitting diode may be referred to as a micro-light-emitting diode (LED).

Figure 3A:
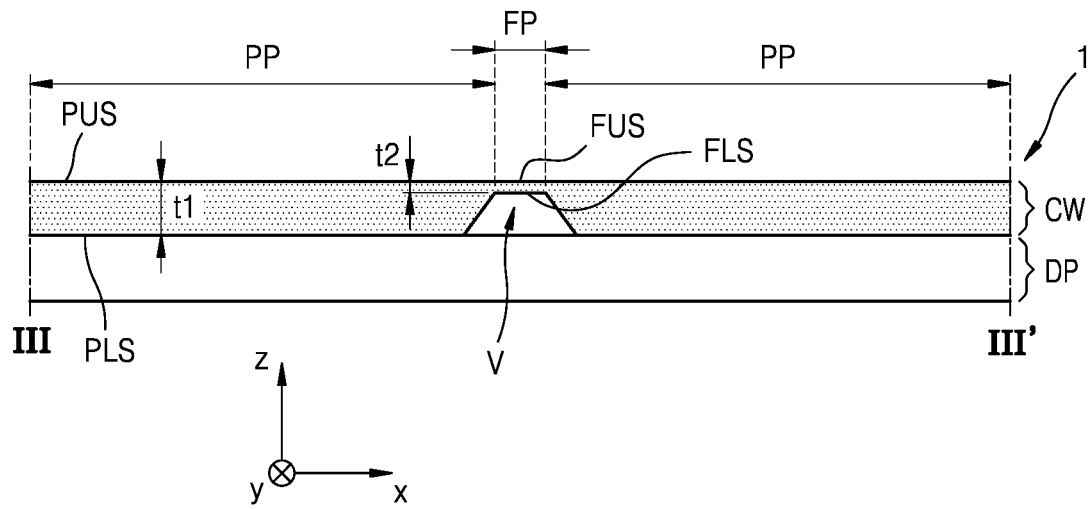
FIGS. 3A and 3B are schematic cross-sectional views illustrating a part of a display apparatus according to an embodiment.
Figure 3B:
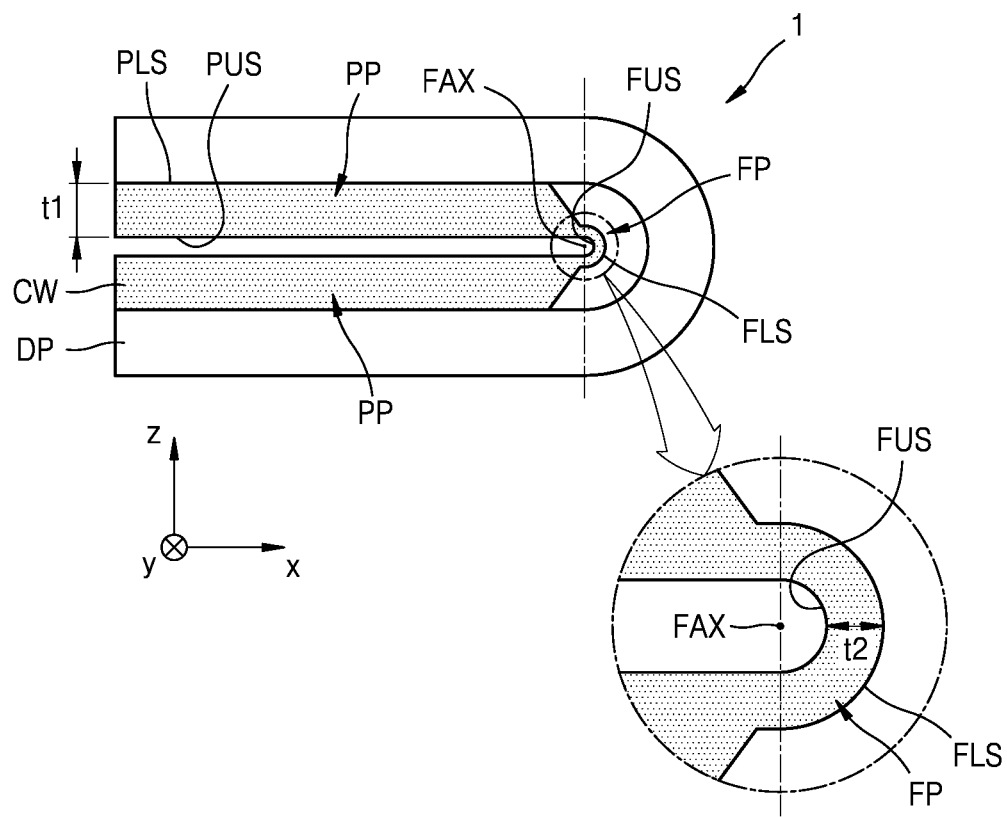

FIGS. 3A and 3B are schematic cross-sectional views illustrating a part of a display apparatus according to an embodiment. FIG. 3A is a schematic cross-sectional view illustrating a display panel and a cover window in a state where a display apparatus is unfolded. FIG. 3B is a schematic cross-sectional view illustrating the display panel and the cover window in a state where the display apparatus is folded.

Referring to FIG. 3A, the cover window CW may include a flat portion PP having a first thickness t1 and a folding portion FP having a second thickness t2. The first thickness t1 of the flat portion PP and the second thickness t2 of the folding portion FP may be different from each other, and, for example, the second thickness t2 may be less than the first thickness t1. In an embodiment, the first thickness t1 may be in a range from about 70 µm (micrometer) to about 100 µm, and the second thickness t2 may be in a range from about 20 µm to about 30 µm. In an embodiment, the first thickness t1 may be in a range from about 70 µm to about 100 µm, and the second thickness t2 may be about 30% of the first thickness t1. Alternatively, the second thickness t2 may be in a range from about 20 µm to about 30 µm, and the first thickness t1 may be 3 times or more than 3 times the second thickness t2. Because the folding portion FP may have a smaller thickness than that of the flat portion PP, the folding portion FP may be more easily bent than the flat portion PP.

The folding portion FP may extend in one or a direction, and may extend parallel to the folding axis FAX (see FIG. 1A). For example, the folding portion FP may extend in a y-direction. The flat portion PP may be adjacent to the folding portion FP, and may be located or disposed on both sides in a direction in which the folding portion FP may extend. As is shown in FIG. 3A, an inclined surface connects one boundary of the flat portion PP of the cover window having a second thickness 12 to one boundary of the folding portion FP of the cover window having a first thickness t1.

The flat portion PP may include a first bottom surface PLS facing the display panel DP, and a first top surface PUS opposite to the first bottom surface PLS. A distance between the first bottom surface PLS and the first top surface PUS of the flat portion PP may define the first thickness t1. Similarly, the folding portion FP may include a second bottom surface FLS facing the display panel DP, and a second top surface FUS opposite to the second bottom surface FLS. A distance between the second bottom surface FLS and the second top surface FUS of the folding portion FP may define the second thickness t2.

The first top surface PUS of the flat portion PP and the second top surface FUS of the folding portion FP may be on the same plane, and may be surfaces seen by a user. In contrast, the first bottom surface PLS of the flat portion PP and the second bottom surface FLS of the folding portion FP may not be on the same plane. The first bottom surface PLS may contact one or a surface of the display panel DP, and the second bottom surface FLS may be spaced apart by a certain or predetermined interval from the one or a surface of the display panel DP. Accordingly, a space V may be formed between the display panel DP and the cover window CW. When seen in a direction in which the folding portion FP extends, a cross-sectional shape of the space V may be a substantially quadrangular shape such as a substantially rectangular shape or a substantially trapezoidal shape, a substantially quadrangular shape with substantially round corners, or a shape such as a semicircle or a part of an ellipse.

The space V may be a space sealed by the display panel DP and the cover window CW. In order to prevent light emitted from the display apparatus 1 or light incident on the display apparatus 1 from being refracted or scattered by the space V to be seen by the user, in an embodiment, the space V may be filled with a material having a refractive index similar to that of the cover window CW. For example, an acrylic resin, an epoxy resin, polyimide, or polyethylene may be filled in the space V. In an embodiment, a cross-sectional shape of the space V may be a substantially quadrangular shape with substantially round corners or a shape such as a semicircle or a part of an ellipse, thereby minimizing the refraction or scattering of light due to the space V and minimizing visual recognition of the space V by the user.

Referring to FIG. 3B, the display apparatus 1 may be folded about the folding axis FAX so that a portion of one or a surface of the display panel DP may face another portion of the one or a surface. The one or a surface of the display panel DP may be a surface on which pixels may be located or disposed to provide an image. For example, the display apparatus 1 may be an in-folding type foldable display apparatus.

As the display panel DP is folded, the cover window CW may also be folded about the folding axis FAX. In this case, the display panel DP may be folded so that portions of the first top surface PUS of the flat portion PP of the cover window CW may face each other. The folding portion FP of the cover window CW may be elongated and/or contracted, so that the cover window CW may be entirely folded. As such, the display apparatus 1 including the cover window CW that may be folded as the display panel DP is folded may be obtained.

Figure 4:
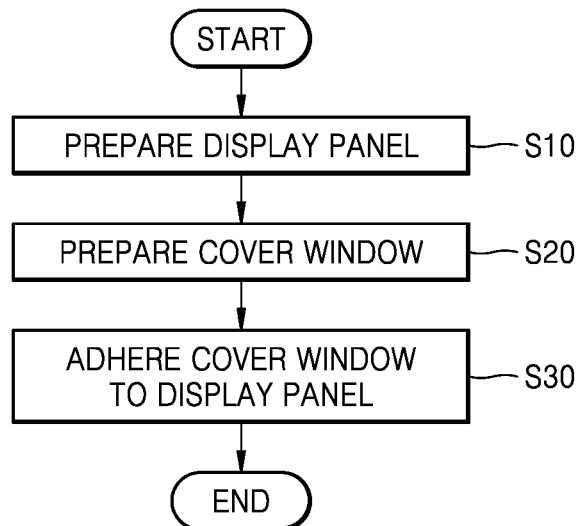
FIG. 4 is a flowchart illustrating operations of a method of manufacturing a display apparatus according to an embodiment.
Figure 5:
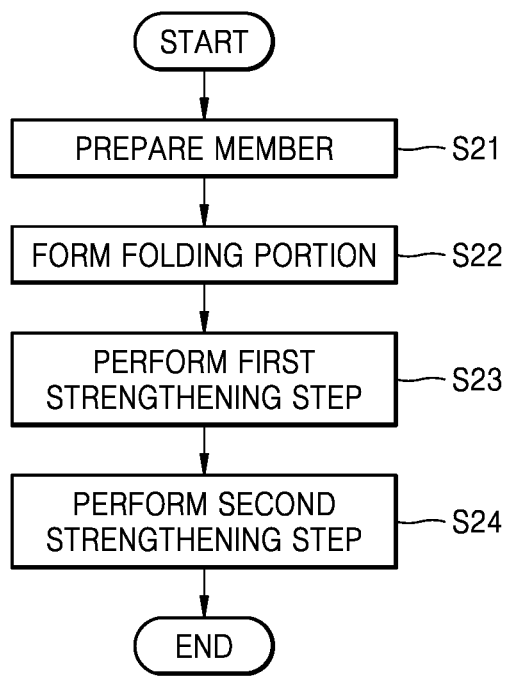
FIG. 5 is a flowchart illustrating an operation of preparing a cover window of a display apparatus according to an embodiment.

FIG. 4 is a flowchart illustrating operations of a method of manufacturing a display apparatus according to an embodiment. FIG. 5 is a flowchart illustrating an operation of preparing a cover window of a display apparatus according to an embodiment.

Referring to FIG. 4, in order to manufacture the display apparatus 1 according to an embodiment, the display panel DP having a stacked structure as described with reference to FIG. 2 may be prepared (operation S10), and the cover window CW may be prepared (operation S20). Next, the cover window CW may be adhered to the display panel DP (operation S30).

Referring to FIG. 5, in order to prepare the cover window CW, a member having the first thickness t1 may be prepared (operation S21). The member may include glass or plastic. For convenience of explanation, the following will be described assuming that the member may include glass.

Next, a portion of the member may be processed to the second thickness t2 by using a polishing process, a heat forming process, or a photolithography process including an etching process, and thus, the folding portion FP may be formed (operation S22). For example, a portion of the member having the first thickness t1 may be the flat portion PP.

Next, a first strengthening operation may be performed to improve the strength of the member (operation S23). In an embodiment, operation S23 in which the first strengthening operation is performed may use a chemical strengthening method using ion exchange. For example, operation S23 in which the first strengthening operation may be performed may be an operation of performing ion exchange on the member by using a mixed salt including a first salt and a second salt that may be different from the first salt. To this end, the member may be submersed in a liquid solution containing the mixed salt including the first salt and the second salt, and ions in the member may be exchanged with at least one of ions of the mixed salt. In an embodiment the first strengthening operation (operation S23) may be performed for about 30 minutes to about 6 hours at a temperature ranging from about 350° C. to about 460° C. In an embodiment, the first salt may be sodium nitrate (NaNO3), the second salt may be potassium nitrate (KNO3), and a mole ratio of the first salt and the second salt may be about 7:3.

Next, in order to further improve the strength of the member and improve characteristics related to a compressive stress in the member, a second strengthening operation may be performed (operation S24). In an embodiment, the second strengthening operation (operation S24) may be performed by a chemical strengthening method using ion exchange, similar to the first strengthening operation (operation S23). However, the second strengthening operation (operation S24) may be performed by an operation of performing ion exchange on the member by using a single salt including the first salt (for example, NaNO3). The member may be submersed in a liquid solution containing the single salt including the first salt, and ions in the member may be exchanged with ions of the single salt. In an embodiment, the second strengthening operation (operation S24) may be performed for about 5 minutes to about 2 hours at a temperature ranging from about 350° C. to about 460° C.

According to an embodiment, the folding portion FP may be previously formed before a strengthening operation. As a comparative example, in a case that a folding portion is formed by processing a portion of the member after a strengthening operation, strengthening characteristics already formed in the strengthening operation may be degraded in a process of forming the folding portion, and a cover window may be unintentionally bent due to an internal stress. However, because the folding portion FP may be previously formed and then a strengthening operation may be performed, degradation of strengthening characteristics and warpage due to an internal stress may be prevented.

Figure 6A:
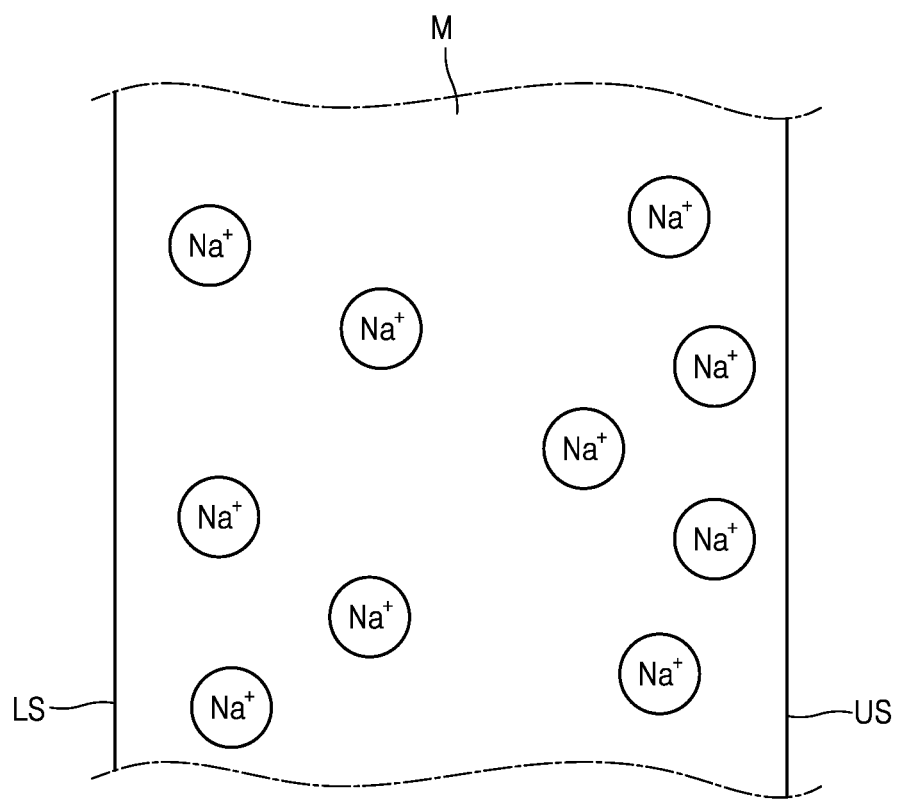
FIGS. 6A through 6C are schematic cross-sectional views illustrating operations of a method of manufacturing a display apparatus according to an embodiment.
Figure 6B:
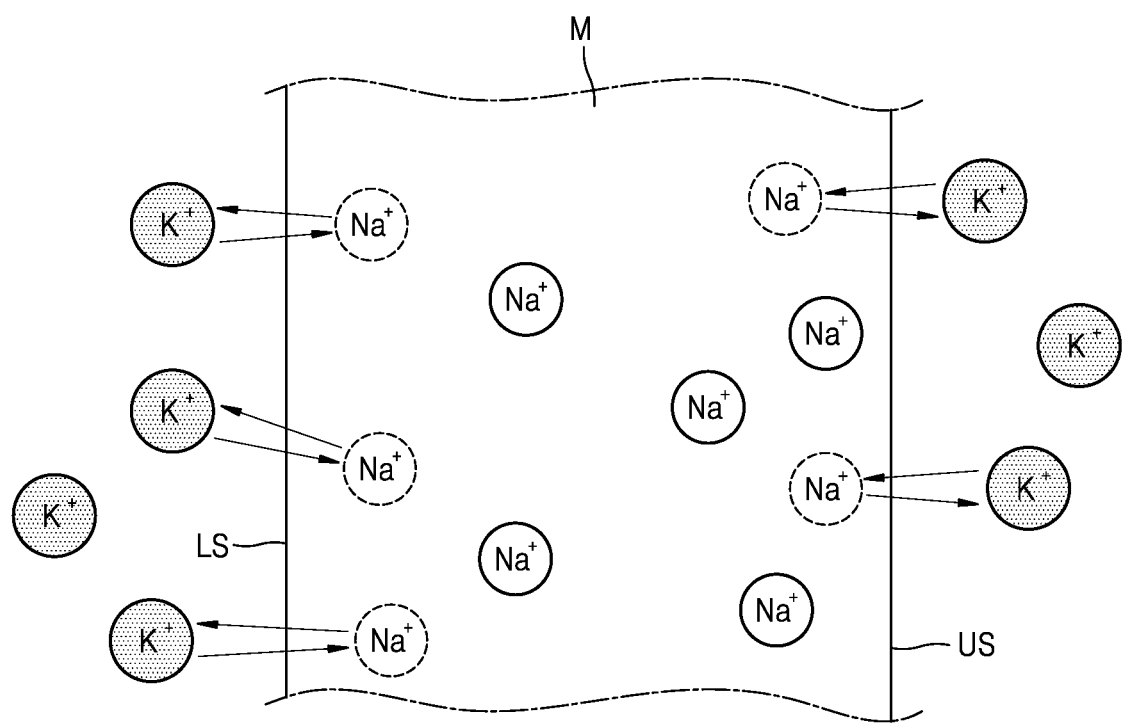
Figure 6C:
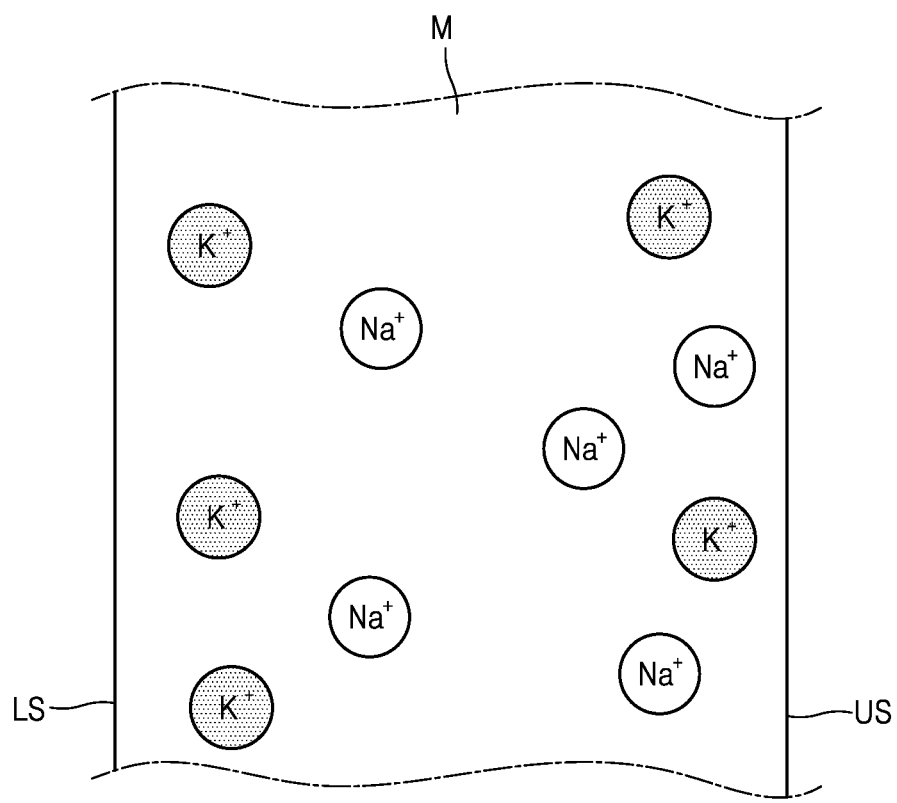

FIGS. 6A through 6C are schematic cross-sectional views illustrating operations of a method of manufacturing a display apparatus according to an embodiment, and may correspond to a first strengthening operation and/or a second strengthening operation.

Referring to FIGS. 6A through 6C, in a member M used to manufacture a cover window, ions located or disposed on a surface of the member M or on a portion adjacent to the surface of the member M may be replaced with other larger ions having the same valence through a first strengthening operation and/or a second strengthening operation. For example, the member M may include monovalent cations of an alkali metal such as lithium ions (Li+), sodium ions (Na+), potassium ions (K+), or rubidium ions (Rb+), and the monovalent cations located or disposed on a surface of the member M or on a portion or region adjacent to the surface of the member M may be exchanged with ions having larger radii such as sodium ions (Na+), potassium ions (K+), rubidium ions (Rb+), or cesium ions (Cs+). For convenience of explanation, the following will be described assuming that the member M may include sodium ions (Na+).

Referring to FIG. 6A, the member M may include sodium ions (Na+), and the sodium ions (N+) may be dispersed in the member M.

Referring to FIG. 6B, the member M be submersed in a solution containing a mixed salt or a single salt including potassium nitrate (KNO3), and may be exposed to potassium ions (K+). At least some or a predetermined number of the potassium ions (K+) may be penetrated into the member M and at least some or a predetermined number of the sodium ions (N+) may be discharged to the outside of the member M, so that the potassium ions (K+) and the sodium ions (N+) may be exchanged in a one-to-one manner. Because the solution may be a liquid solution, the solution may be easily provided to both a bottom surface LS and a top surface US of the member M, and thus ion exchange may occur on both the bottom surface LS and the top surface US of the member M.

Referring to FIG. 6C, because the exchanged potassium ions (K+) have larger radii than the sodium ions (N+), a compressive stress in the member M may occur. As the number of the exchanged potassium ions (K+) increases, the compressive stress in the member M may increase. Because ion exchange may be performed through both the bottom surface LS and the top surface US of the member M, the number of the potassium ions (K+) may be the largest on both the bottom surface LS and the top surface US and may decrease toward the inside of the member M. Accordingly, the compressive stress in the member M may be the largest on both the bottom surface LS and the top surface US, and may decrease toward the inside of the member M. Accordingly, the compressive stress may provide the member M with strength and durability against an external impact.

The potassium ions (K+) penetrated through both the bottom surface LS and the top surface US of the member M may be diffused to a certain or predetermined depth of the member M. The compressive stress may occur from both the bottom surface LS and the top surface US to the certain or predetermined depth, whereas a tensile stress may occur in a central portion of the member M that may be deeper than the certain or predetermined depth. For example, the compressive stress at the certain or predetermined depth may be about 0. The tensile stress may increase or may be constant toward the center of the member M. The compressive stress stored in and near both the bottom surface LS and the top surface US of the member M may be balanced with the tensile stress stored in the central portion of the member M. Due to the compressive stress and the tensile stress stored in the member M, the member M may have high strength.

Figure 7A:
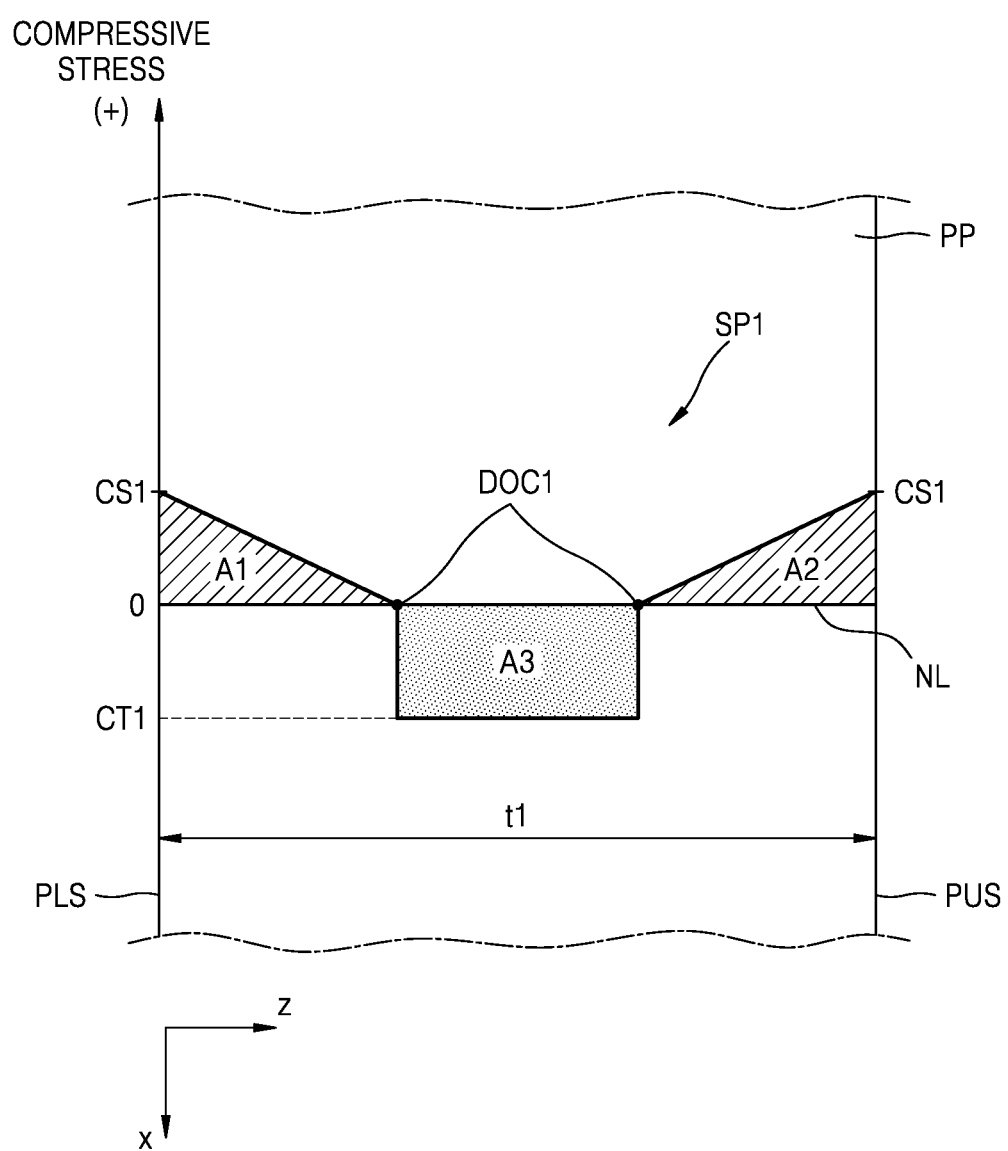
FIGS. 7A and 7B are stress profiles of a flat portion of a cover window of a display apparatus according to an embodiment.
Figure 7B:
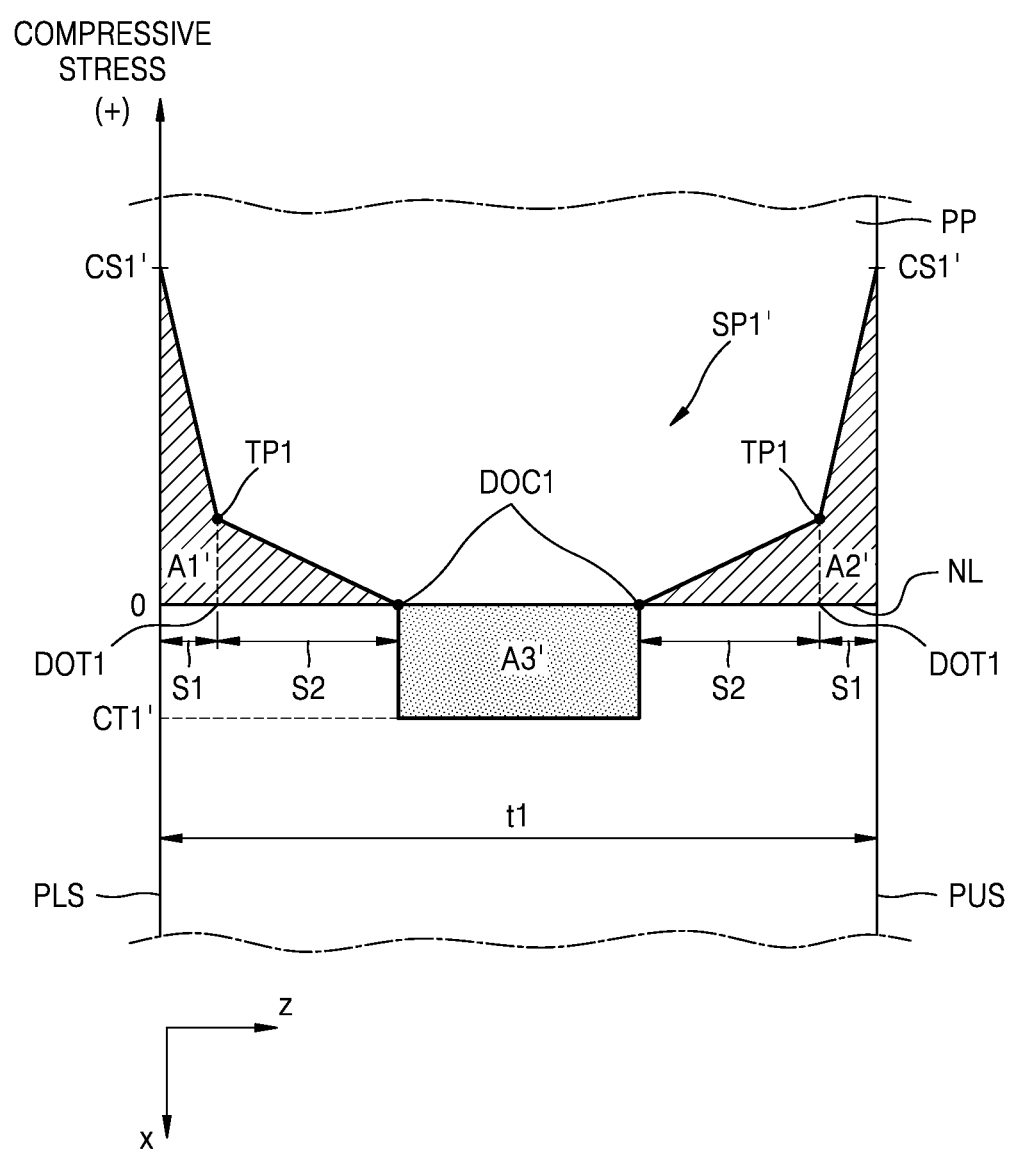

FIGS. 7A and 7B are stress profiles of a flat portion of a cover window of a display apparatus according to an embodiment.

The stress profiles of FIGS. 7A and 7B each show a first stress profile that is a stress change of the flat portion PP along a depth direction from a surface of the flat portion PP of the cover window CW, and an intermediate first stress profile SP1 of FIG. 7A may be a stress profile of the flat portion PP right after a first strengthening operation. As is explained above a stress profile represents an amount of compressive or tensile stress stored in the cover window at particular locations.

Referring to FIG. 7A, a compressive stress of the flat portion PP may vary according to a depth. The term 'depth' may be defined as a distance from each of the first bottom surface PLS and the first top surface PUS of the flat portion PP to the inside of the flat portion PP, and the term 'depth direction' may be defined as a direction from the first bottom surface PLS of the flat portion PP in a +z-direction to the inside of the flat portion PP and a direction from the first top surface PUS of the flat portion PP in a −z-direction to the inside of the flat portion PP. Accordingly, the depth may be symmetrical about a center line (not shown) extending in a ±x-direction and passing through a point at which the first thickness t1 of the flat portion PP may be about ½.

An arrow direction of a vertical axis indicating the compressive stress in FIG. 7A may be a direction in which the compressive stress may increase. The compressive stress may have a largest value on each of the first bottom surface PLS and the first top surface PUS of the flat portion PP, and may decrease toward the center of the flat portion PP. In a case that the depth reaches a certain or predetermined depth from the first bottom surface PLS and the first top surface PUS of the flat portion PP, the compressive stress may be about 0, and the certain or predetermined depth may be referred to as a first compression depth DOC1. For example, the first compression depth DOC1 may be a depth from the first top surface PUS or the first bottom surface PLS to a point at which a neutral line NL along which the compressive stress may be about 0 and the intermediate first stress profile SP1 may intersect each other.

The compressive stress may have a negative (−) value at a depth greater than the first compression depth DOC1, and a negative compressive stress may be a tensile stress. For example, the flat portion PP may have different stresses with the first compression depth DOC1 therebetween. The tensile stress may be an internal stress formed to correspond to the compressive stress. Because the flat portion PP forms the tensile stress to correspond to the compressive stress, deformation due to the compressive stress may be minimized and stress balance may be achieved.

The flat portion PP may have a first central tensile stress CT1 at a depth about equal to or greater than the first compression depth DOC1. Although the tensile stress may have a constant value in an interval equal to or greater than the first compression depth DOC1 in FIG. 7A, this is merely an example, and the tensile stress may be variable. In this case, the first central tensile stress CT1 may be defined as an average value of the tensile stress in the interval about equal to or greater than the first compression depth DOC1.

Because the compressive stress and the tensile stress may be balanced as described above, a sum of areas A1 and A2 formed by the intermediate first stress profile SP1 in an interval from each of the first bottom surface PLS and the first top surface PUS to the first compression depth DOC1 may be substantially the same as an area A3 formed by the intermediate first stress profile SP1 in an interval about equal to or greater than the first compression depth DOC1.

According to an embodiment of the disclosure, the flat portion PP of the cover window CW obtained through the first strengthening operation may have the intermediate first stress profile SP1 of FIG. 7A. As described above, the intermediate first stress profile SP1 may have a largest compressive stress on the first bottom surface PLS and the first top surface PUS of the flat portion PP, and the largest compressive stress may be referred to as a first surface compressive stress CS1. The first surface compressive stress CS1 may have a value about equal to or greater than about 300 MPa. Also, according to an embodiment, the first compression depth DOC1 of the intermediate first stress profile SP1 may have a value about equal to or greater than about 15% of the first thickness t1 of the flat portion PP. An absolute value of a gradient of a profile in the interval from each of the first bottom surface PLS and the first top surface PUS to the first compression depth DOC1 may be obtained through Equation 1, and may be, for example, about equal to or greater than about 6 MPa/μm, about equal to or greater than about 8 MPa/μm, about equal to or greater than about 13 MPa/μm, or about equal to or greater than about 20 MPa/μm.

$$\text{Gradient} = \left| \frac{\text{first surface compressive stress } (CS1)}{\text{first compression depth } (DOC1)} \right| \quad \text{Equation 1}$$

The stress profile of FIG. 7B shows a final first stress profile SP1' after a second strengthening operation. Referring to FIG. 7B, the compressive stress on and near the first bottom surface PLS and the first top surface PUS of the flat portion PP may increase through the second strengthening operation. Accordingly, the final first stress profile SP1' having more improved compressive stress characteristics than the intermediate first stress profile SP1 (see FIG. 7A) may be obtained. Because ion exchange using a single salt may be performed in the second strengthening operation, the final first stress profile SP1' may have a surface compressive stress CS1' that may be greater than the surface compressive stress CS1 of the intermediate stress profile SP1 right after the first strengthening operation using a mixed salt. In an embodiment, the surface compressive stress CS1' of the final first stress profile SP1' may be in a range from about 650 MPa to about 800 MPa. The surface compressive stress CS1' that may be a final surface compressive stress of the flat portion PP may be greater than a surface compressive stress CS2' that may be a final surface compressive stress of the folding portion FP described below with reference to FIG. 8B.

Also, the final first stress profile SP1' may include a first transition point TP1 at which a gradient of a compressive stress profile may rapidly change through the second strengthening operation. A depth from each of the first bottom surface PLS and the first top surface PUS of the flat portion PP to the first transition point TP1 may be referred to as a first transition depth DOT1. The first transition depth DOT1 may be between each of the first bottom surface PLS and the first top surface PUS of the flat portion PP and the first compression depth DOC1. For example, the first transition depth DOT1 may be less than about 10% of the first thickness t1 of the flat portion PP.

The final first stress profile SP1' may include a first interval S1 from each of the first bottom surface PLS and the first top surface PUS of the flat portion PP to the first transition depth DOT1, and a second interval S2 from the first transition depth DOT1 to the first compression depth DOC1. For example, an absolute value of a gradient of a profile in the first interval S1 may be greater than an absolute value of a gradient of a profile in the second interval S2. The absolute value of the profile in the first interval S1 may satisfy Equation 2, and may be, for example, greater than about 35 MPa/μm, greater than about 50 MPa/μm, or greater than about 70 MPa/μm.

$$\text{Gradient in first interval} > \left| \frac{\text{change amount of first surface compressive stress } (CS1-CS1')}{\text{first transition depth } (DOT1)} \right| \quad \text{Equation 2}$$

As the surface compressive stress CS1' changes through the second strengthening operation, areas A1' and A2' formed by the final first stress profile SP1' in an interval from each of the first bottom surface PLS and the first top surface PUS to the first compression depth DOC1 may also change. Because the compressive stress and the tensile stress may be balanced as described above, an area A3' formed by the final first stress profile SP1' in an interval about equal to or greater than the first compression depth DOC1 may change to be substantially the same as a sum of the areas A1' and A2', and thus a first central tensile stress CT1' may also change.

According to an embodiment, the flat portion PP of the cover window may obtain the first compression depth DOC1 that may be sufficiently large through the first strengthening operation, and may obtain the surface compressive stress CS1' that may be further increased through the second strengthening operation. Accordingly, the reliability of durability of the flat portion PP may be ensured, and surface strength against an external impact may be improved.

Figure 8A:
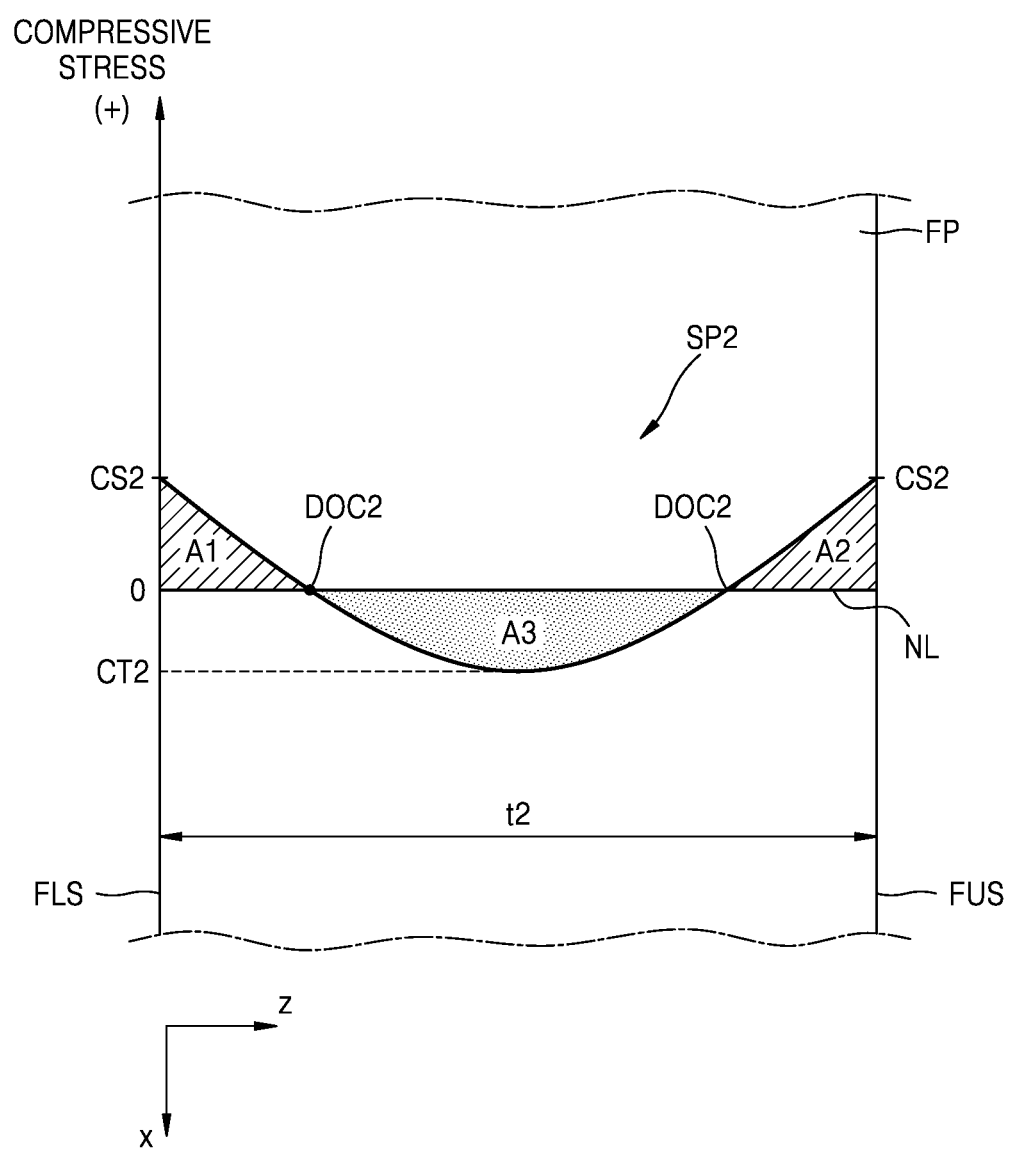
FIGS. 8A and 8B are stress profiles of a folding portion of a cover window of a display apparatus according to an embodiment.
Figure 8B:
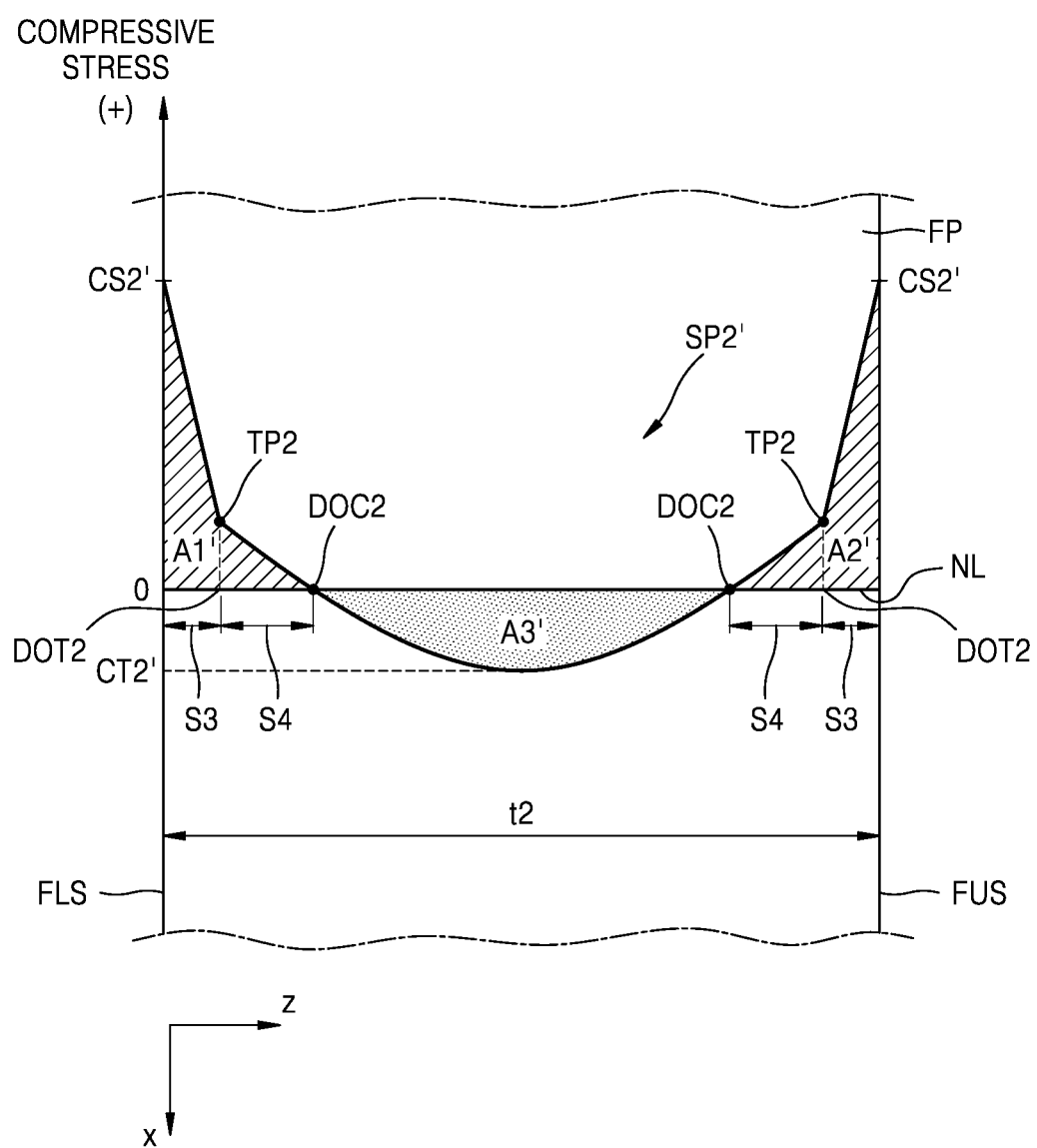

FIGS. 8A and 8B are stress profiles of a folding portion of a cover window of a display apparatus according to an embodiment.

The stress profiles of FIGS. 8A and 8B each show a second stress profile that may be a stress change of the folding portion FP along a depth direction from a surface of the folding portion FP of the cover window CW, and an intermediate second stress profile SP2 of FIG. 8A may be a stress profile of the folding portion FP after a first strengthening operation.

Referring to FIG. 8A, the intermediate second stress profile SP2 of the folding portion FP may have a profile different from that of the intermediate first stress profile SP1 (see FIG. 7A) of the flat portion PP. A stress profile may vary according to a thickness of the cover window CW that may be an object subjected to ion exchange, as well as a temperature, a time, and a frequency of the ion exchange, whether to perform heat treatment, a type of a single salt, a type of a mixed salt, and a mole ratio. According to an embodiment, the first thickness t1 of the flat portion PP may be determined as a target in a condition of the ion exchange in the first strengthening operation. For example, because the second thickness t2 of the folding portion FP may be less than the first thickness t1, the ion exchange may be performed over the entire second thickness t2. Accordingly, the intermediate second stress profile SP2 of the folding portion FP may have a shape including a curved line, unlike the intermediate first stress profile SP1 of the flat portion PP.

In the folding portion FP, although the ion exchange may occur over the entire second thickness t2, a compressive stress may be the largest on the second bottom surface FLS and the second top surface FUS, and a tensile stress may correspondingly occur at a depth greater than a certain or predetermined depth. The certain or predetermined depth may be referred to as a second compression depth DOC2, and may be a depth at which the compressive stress may be about 0. For example, the second compression depth DOC2 may be a depth from the second top surface FUS or the second bottom surface FLS of the folding portion FP to a point at which a neutral line NL and the intermediate second stress profile SP2 may intersect each other.

The folding portion FP may have a second central tensile stress CT2 at a depth greater than the second compression depth DOC2. The second central tensile stress CT2 may be defined as a largest value of the tensile stress in an interval about equal to or greater than the second compression depth DOC2.

Because the compressive stress and the tensile stress may be balanced, a sum of areas A1 and A2 formed by the intermediate second stress profile SP2 in an interval from each of the second top surface FUS and the second bottom surface FLS to the second compression depth DOC2 may be substantially the same as an area A3 formed by the intermediate second stress profile SP2 in an interval equal to or greater than the second compression depth DOC2.

As described above, the folding portion FP of the cover window CW obtained through the first strengthening operation may have the intermediate second stress profile SP2 of FIG. 8A. The intermediate second stress profile SP2 may have a largest compressive stress on the second bottom surface FLS and the second top surface FUS of the folding portion FP, and the largest compressive stress may be referred to as a second surface compressive stress CS2. The second surface compressive stress CS2 may have a value about equal to or greater than about 150 MPa. Also, according to an embodiment, the second compression depth DOC2 of the intermediate second stress profile SP2 may have a value ranging from about 20% to about 25% of the second thickness t2 of the folding portion FP. An absolute value of an average gradient of a profile in the interval from each of the second bottom surface FLS and the second top surface FUS to the second compression depth DOC2 may satisfy Equation 3, and may be, for example, about equal to or greater than about 20 MPa/μm, about equal to or greater than about 25 MPa/μm, about equal to or greater than about 30 MPa/μm, or about equal to or greater than about 37.5 MPa/μm.

$$\text{Average gradient} = \left| \frac{\text{second surface compressive stress } (CS2)}{\text{second compression depth } (DOC2)} \right| \quad \text{Equation 3}$$

The stress profile of FIG. 8B shows a final second stress profile SP2' after a second strengthening operation. Referring to FIG. 8B, the compressive stress on and near the bottom surface FLS and the top surface FUS of the folding portion FP may increase through the second strengthening operation, and the final second stress profile SP2' having more improved compressive stress characteristics than the intermediate second stress profile SP2 (see FIG. 8A) may be obtained. Because ion exchange using a single salt may be performed in the second strengthening operation, the final second stress profile SP2' may have a surface compressive stress CS2' that may be greater than the surface compressive stress CS2 of the intermediate second stress profile SP2 right after the first strengthening operation using a mixed salt. In an embodiment, the surface compressive stress CS2' of the final second stress profile SP2' may be in a range from about 400 MPa to about 700 MPa.

Also, the final second stress profile SP2' may include a second transition point TP2 at which a gradient of a compressive stress profile may rapidly change through the second strengthening operation. A depth from each of the second bottom surface FLS and the second top surface FUS of the folding portion FP to the second transition point TP2 may be referred to as a second transition depth DOT2. The second transition depth DOT2 may be between each of the second bottom surface FLS and the second top surface FUS of the folding portion FP and the second compression depth DOC2. For example, the second transition depth DOT2 may be less than about 20% of the second thickness t2 of the folding portion FP. The final second stress profile SP2' may include a profile of a curved line in an interval about equal to or greater than the second transition depth DOT2.

The final second stress profile SP2' may include a third interval S3 from each of the second bottom surface FLS and the second top surface FUS of the folding portion FP to the second transition depth DOT2, and a fourth interval S4 from the second transition depth DOT2 to the second compression depth DOC2. For example, an absolute value of a gradient of a profile in the third interval S3 may be greater than an absolute value of an average gradient of a profile in the fourth interval S4. The absolute value of the gradient of the profile in the third interval S3 may satisfy Equation 4, and may be, for example, greater than about 40 MPa/μm, greater than about 62.5 MPa/μm, or greater than about 137.5 MPa/μm.

Equation 4

Gradient in third interval >

$$\left| \frac{\text{change amount of } secondt \text{ surface compressive stress } (CS2 - CS2')}{\text{second transition depth } (DOT2)} \right|$$

As the surface compressive stress CS2' changes through the second strengthening operation, areas A1' and A2' formed by the final second stress profile SP2' in an interval from each of the second bottom surface FLS and the second top surface FUS to the second compression depth DOC2 may also change. Because the compressive stress and the tensile stress may be balanced as described above, an area A3' formed by the final second stress profile SP2' in an interval about equal to or greater than the second compression depth DOC2 may change to be substantially the same as a sum of the areas A1' and A2', and thus the second central tensile stress CT2' may also change.

According to an embodiment of the disclosure, the folding portion FP of the cover window may obtain a sufficiently high surface compressive stress through the second strengthening operation, and may improve surface strength against an external impact.

The above stress profiles may be measured non-destructively by using FSM-6000LE that is a surface stress meter of Orihara, or may be measured by using HKL-10-HPAS that is an automatic strain viewer.

As a comparative example, in a case that a strengthening operation using a single salt or a mixed salt is performed only once, a deviation of a surface compressive stress between a flat portion and a folding portion may increase, the flat portion may fail to have a sufficient compression depth, or the folding portion may fail to have a sufficient surface compressive stress. However, according to an embodiment, a high surface compressive stress of each of the flat portion PP and the folding portion FP of the cover window CW may be ensured through two strengthening operations, and a deviation of a surface compressive stress between the flat portion PP and the folding portion FP may also be reduced. Also, because the flat portion PP may have a sufficient compression depth, the reliability of durability may be ensured. Accordingly, the display apparatus 1 including the cover window CW having strength and durability high enough not to be easily damaged by an external impact may be obtained.

According to the one or more embodiments, a display apparatus including a cover window that may be foldable and have improved durability and strength against an impact and a method of manufacturing the display apparatus may be provided. By way of example, a display apparatus having strength and durability high enough not to be easily damaged due to improved compressive stress characteristics of a flat portion and a folding portion, and a method of manufacturing the display apparatus may be provided. However, the scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
   a display panel comprising pixels; and
   a cover window disposed on the display panel,
   wherein the cover window comprises:
   a flat portion having a first thickness; and
   a folding portion spaced apart from the flat portion, the folding portion having a second thickness that is less than the first thickness of the flat portion, the folding portion extending from the flat portion,
   a thickness of the cover window decreases from the flat portion to the folding portion,
   a first stress profile of the flat portion of the cover window that is a stress change along a depth direction from a surface of the flat portion of the cover window is different from a second stress profile of the folding portion of the cover window that is a stress change along a depth direction from a surface of the folding portion of the cover window, the first stress profile representing an amount of compressive or tensile stress stored in the cover window at particular locations, and
   a surface compressive stress on the surface of the flat portion of the cover window is different from a surface compressive stress on the surface of the folding portion of the cover window.

2. The display apparatus of claim 1, wherein a portion of the cover window extending from the flat portion of the cover window to the folding portion of the cover window consist of an inclined surface.

3. The display apparatus of claim 2, wherein the inclined surface connects the flat portion of the cover window having a second thickness to the folding portion of the cover window having a first thickness.

4. The display apparatus of claim 1, wherein
   the flat portion of the cover window is attached to one surface of the display panel, and
   a sealed space is arranged between the display panel and the folding portion of the cover window.

5. The display apparatus of claim 4, wherein the sealed space is filled with a refractive material having a refractive index corresponding to a refractive index of the cover window.

6. The display apparatus of claim 4, wherein a cross-sectional area of the sealed space narrows in a direction away from the display panel.

7. The display apparatus of claim 1, wherein one surface of the folding portion of the cover window facing one surface of the display panel comprises a flat surface.

8. The display apparatus of claim 1, wherein the second thickness of the cover window is about 30% of the first thickness of the cover window.

9. The display apparatus of claim 8, wherein the first thickness of the cover window is about 70 micrometers to about 100 micrometers.

10. The display apparatus of claim 1, wherein a surface compressive stress on the surface of the flat portion of the cover window is greater than a surface compressive stress on the surface of the folding portion of the cover window.

11. The display apparatus of claim 1, wherein the first stress profile has a maximum compressive stress on a first bottom surface and a first top surface of the flat portion of the cover window, and the maximum compressive stress corresponds to a surface compressive stress of the flat portion of the cover window.

12. The display apparatus of claim 1, wherein
the second stress profile has a maximum compressive stress on a first bottom surface and a first top surface of the folding portion of the cover window, and
the maximum compressive stress corresponds to a surface compressive stress of the folding portion of the cover window.

13. The display apparatus of claim 1, wherein a surface compressive stress on the one surface of the flat portion of the cover window is about 650 MPa to about 800 MPa.

14. The display apparatus of claim 1, wherein a surface compressive stress on the surface of the folding portion of the cover window is about 400 MPa to about 700 MPa.

15. The display apparatus of claim 1, wherein
an absolute value of a gradient in a first interval of the first stress profile of the flat portion of the cover window is greater than an absolute value of a gradient in a second interval adjacent to the first interval,
the first interval is an interval from the surface of the flat portion of the cover window to a first transition depth, and
the second interval is an interval from the first transition depth to a first compression depth.

16. The display apparatus of claim 15, wherein a compressive stress at the first compression depth is about 0 MPa.

17. The display apparatus of claim 15, wherein the first compression depth is about 15% of the first thickness of the flat portion of the cover window.

18. The display apparatus of claim 15, wherein the first transition depth is about 10% of the first thickness of the flat portion of the cover window.

19. The display apparatus of claim 15, wherein the absolute value of the gradient in the first interval is about 35 MPa/μm.

20. The display apparatus of claim 1, wherein
an absolute value of a gradient in a third interval of the second stress profile of the folding portion of the cover window is greater than an absolute value of a gradient in a fourth interval adjacent to the third interval,
the third interval is an interval from the surface of the folding portion of the cover window to a second transition depth, and
the fourth interval is an interval from the second transition depth to a second compression depth.

21. The display apparatus of claim 20, wherein the second stress profile of the folding portion of the cover window comprises a curved line in an interval about equal to or greater than the second transition depth of the folding portion of the cover window.

22. The display apparatus of claim 20, wherein a compressive stress at the second compression depth is about 0 MPa.

23. The display apparatus of claim 20, wherein the second compression depth is about 20% to about 25% of the second thickness of the folding portion of the cover window.

24. The display apparatus of claim 20, wherein the second transition depth is less than about 20% of the second thickness of the folding portion of the cover window.

25. The display apparatus of claim 20, wherein the absolute value of the gradient in the third interval is greater than about 40 MPa/μm and less than about 137.5 MPa/μm.

26. A method of manufacturing a display apparatus, the method comprising:
preparing a display panel;
preparing a cover window; and
adhering the cover window to the display panel,
wherein the cover window comprises a flat portion having a first thickness, and a folding portion having a second thickness that is less than the first thickness, the folding portion extending from the flat portion,
a first stress profile of the flat portion that is a stress change along a depth direction from a surface of the flat portion is different from a second stress profile of the folding portion that is a stress change along a depth direction from a surface of the folding portion, and
the preparing of the cover window comprises:
preparing a member including the first thickness;
forming the folding portion to the second thickness by processing a part of the member;
performing a first strengthening operation on the member by ion exchange by using a mixed salt comprising a first salt and a second salt that is different from the first salt; and
performing a second strengthening operation on the member by ion exchange by using a single salt comprising the first salt.

27. The method of claim 26, wherein the folding portion is previously formed before the first strengthening operation and the second strengthening operation.

28. The method of claim 26, wherein
the first strengthening operation is performed for about 30 minutes to about 6 hours at a temperature in a range from about 350° C. to about 460° C., and
a mole ratio between the first salt and the second salt is about 7:3.

29. The method of claim 26, wherein the second strengthening operation is performed for about 5 minutes to about 2 hours at a temperature in a range from about 350° C. to about 460° C.

30. The method of claim 26, wherein the first salt comprises sodium nitrate ($NaNO_3$), and the second salt comprises potassium nitrate ($KNO_3$).

31. The display apparatus of claim 1, wherein a thickness of the cover window decreases linearly in at least a portion of a distance from the flat portion to the folding portion.

* * * * *